United States Patent [19]

Smiggen et al.

[11] 4,116,715
[45] Sep. 26, 1978

[54] METHOD FOR REMOVING PHOTOPOLYMERS FROM METAL SUBSTRATES

[76] Inventors: Frank J. Smiggen, 350 Glenview Dr., #14, San Francisco, Calif. 94131; Devitt S. Burry, 311 Corbett #8, San Francisco, Calif. 94114; Joseph Kallaby, 350 Glenview Dr. #10, San Francisco, Calif. 94131; Wayne H. Goltz, 1516 NE. 26th St., Wilton Manors, Fla. 33308

[21] Appl. No.: 816,446

[22] Filed: Jul. 18, 1977

[51] Int. Cl.$^2$ .............................. B08B 1/00; B08B 3/10
[52] U.S. Cl. ...................................... 134/6; 101/423; 101/424; 101/467; 134/38
[58] Field of Search ............... 134/6, 38; 252/DIG. 8; 101/423, 424, 425, 467; 96/35.1; 156/344

[56] References Cited

U.S. PATENT DOCUMENTS

| 3,063,873 | 11/1962 | Saroyan | 134/38 X |
| 3,766,076 | 10/1973 | Murphy | 134/38 X |
| 3,796,602 | 3/1974 | Briney et al. | 134/38 |
| 3,801,328 | 4/1974 | Takimoto et al. | 96/35.1 X |
| 3,928,113 | 12/1975 | Rosenberg | 156/344 |
| 3,980,587 | 9/1976 | Sullivan | 134/38 X |

Primary Examiner—Marc L. Caroff
Attorney, Agent, or Firm—Flehr, Hohbach, Test, Albritton & Herbert

[57] ABSTRACT

A developed photopolymer layer is completely removed from a support substrate of a printing plate. Such photopolymer is developed by photoinitiated polymerization from at least one water-soluble ethylenic monomer and includes a partially saponified polyvinyl acetate. For removal, the photopolymer layer is immersed in boiling water for sufficient time to swell the layer and then the swollen polymer is scraped from the printing plate.

6 Claims, No Drawings

METHOD FOR REMOVING PHOTOPOLYMERS FROM METAL SUBSTRATES

BACKGROUND OF THE INVENTION

The present invention relates to the cleaning of the developed photopolymer layer from a photopolymer printing plate.

Photoinitiated polymerized plates are used in the printing industry. It is conventional to dispose of such plates subsequent to printing because there is no known technique for readily removing the polymer without harming the underlying substrate of the plate. This is wasteful as the plates, typically formed of aluminum, could be reused if an effective technique were developed for cleaning.

Various techniques have been employed for removing coating compositions from lithographic plates. U.S. Pat. No. 3,250,644 discloses the use of an acetone and hydrofluoric acid solution for this purpose. This is costly and requires the disposal of the acidic organic solvent which is potentially harmful to the environment. Other techniques for cleaning polymeric substrates have all required the use of organic solvents. See, U.S. Pat. Nos. 3,625,763, 3,784,477, 3,796,602, and 3,998,654.

SUMMARY OF THE INVENTION AND OBJECTS

In accordance with the present invention, a developed photopolymer layer of a particular type is readily cleaned from its underlying substrate. The layer is developed by photoinitiation from a water-soluble ethylenic monomer, preferably including a saponified polyvinyl acetate. The layer is removed by exposing it to hot, preferably boiling, water for a sufficient time to swell the layer, and then gently scraping the swollen polymer from the substrate.

It is an object of the invention to provide a convenient technique for removing the photopolymer layer of a particular type from a printing plate.

It is a particular object of the invention to accomplish such cleaning without organic solvent.

It is a further object of the invention to clean such plates while leaving the underlying surface in a state of sufficient smoothness for repeated deposition of photopolymer for subsequent development.

Further objects and features of the invention will be apparent from the following description.

DETAILED DESCRIPTION OF THE PREFERRED EMBODIMENTS

The technique of the present invention is capable of removing the developed photopolymer layer from the printing plate without the use of organic solvent. It finds particular utility when cleaning the plate of the type disclosed in U.S. Pat. No. 3,801,328, the disclosure of which is incorporated by reference at this point.

Briefly described, the photopolymerization composition of the above patent includes the following three components: (a) at least one unsaturated ethylenic monomer, preferably at a boiling point above 100° C, and a molecular weight below 1500 and 1 to 4 polymerizable ethylenic groups, being polymerized by actinic light in the presence of a photopolymerization initiator; (b) a photopolymerization initiator; and (c) a polymer having both acetyl groups and hydroxy groups produced by saponification of polyvinyl acetate and the like and being water-soluble and compatible with the monomer component of (a).

The preferred disclosed ratios include 0.1 to 3.0 parts of component (a), 0.001 to 0.15 parts of component (b), and 0.1 to 1.0 parts of component (c).

As disclosed in the above patent, component (a) may be (1) an acrylic or methacrylic ester of a lower alkanol having one or more hydroxy groups, or (2) an acrylic or methacrylic ester of polyethylene glycol [HO(CH$_2$CH$_2$O)$_n$H] which is etherified or esterified at one end, or (3) a mixture of both (1) and (2).

Examples of unsaturated ethylenic compounds set forth in the patent are (1) B-hydroxyethyl acrylate, B-hydroxyethyl methacrylate, B-hydroxypropyl acrylate, and B-hydroxypropyl methacrylate, wherein $n$ is 1, the compound being esterified at one end of the diol, and (2) methoxypolyethylene glycol monoacrylate, methoxypolyethylene glycol monomethacrylate, and polyethylene glycol diester (e.g., polyethylene diacrylate or polyethylene glycol dimethacrylate), being an acrylic or methacrylic half ester of polyethylene glycol and being esterified at the hydroxy group on the opposite side from the ester moiety of the molecule. In such polyethylene glycol derivatives (2), $n$ is preferably 1 and 9 to 23, i.e., the number of ethylene oxide units is either one or nine to 23. Within this range of $n$, the ethylenic compound is compatible with the other components in the preparation of the photopolymerizable composition, and the resulting composition shows an excellent water-solubility in the preparation of a printing plate. Further, other effective compound such as glycerol dimethacrylate, pentaerythritol dimethacrylate, trimethylopropane trimethacrylate, trimethyol ethane trimethacrylate, and tetramethylolmethane tetramethacrylate may be used solely or in combination.

The ethylenic unsaturated monomer component (a) can include mixtures of both mono- and di-functional compounds, the mono-functional compounds serving as solubilizing materials for the initiator component, and the di- and poly-functional compounds enhancing the adhesive characteristics of the resultant photopolymerizable composition. As the initiator component (b), benzoin alkylate compounds, preferably having one to eight carbon atoms, are used. Benzoin alkylate compounds are preferred. Specific examples of the benzoin alkylate compounds found useful in the practice of this invention are methyl, ethyl, isopropyl, octyl, vinyl and allyl ethers of benzoin, i.e., benzoin methyl ether, benzoin ethyl ether, benzoin vinyl ether, benzoin allyl ether, etc.

The polymer component (c), used in the practice of this invention is a partially saponified polyvinyl acetate, preferably having an average degree of polymerization of 300 to 2,000 and saponification degree of 65 to 99 mole percent. If a suitable partially saponified polyvinyl acetate having a low saponification degree as a homopolymer, a copolymer obtained, for example, by copolymerizing vinyl acetate with maleic anhydride can be partially saponified to give the desired polymer. Saponification as used herein is intended to mean the conversion of ester groups or the like into alcohol groups and the saponification degree represents the extent to which ester groups or the like have been converted to alcohol or hydroxy groups.

The foregoing photopolymerizable composition is suitably deposited on a metallic base substrate formed of a metal such as aluminum, tin, iron or galvanized steel.

The monomer components of the above printing plate are polymerized by exposing the photopolymerizable composition to light so that the base polymer induces a chain transfer reaction and production of a homopolymer since the portion of the base polymer which undergoes the chain transfer reaction and the polymer formed from the monomers becomes united, the water-insolubility of the plate is elevated. The homopolymer is grafted to the base polymer which is generated at the same time as homopolymerization of the monomers by using the partially saponified polyvinyl alcohol. The plate is developed with water.

The present invention resides in the discovery that the developed photopolymer layer on a printing plate of the foregoing type may be completely removed in a simple and efficient manner. Thus, after printing, the metal substrates may be recycled for repeated use.

In general, the technique of the present invention comprises exposing the foregoing developed photopolymer layer of the printing plate to hot water for sufficient time to swell the layer. Then, the swollen polymer may be scraped from the substrate. It has been found that immersion of the plate in boiling water for at least five minutes and preferably at least about 6 to 8 minutes causes the developed photopolymer to become substantially water-swollen. Then, the swollen photopolymer is readily removed as by gentle scraping with a brush or other scraping implement.

What is claimed is:

1. A method of completely removing a developed photopolymer layer from a support substrate of a photopolymer printing plate, said layer comprising developed photopolymer polymerized by photoinitiation from at least one water-soluble ethylenic monomer and a water-soluble polymer having both acetyl and hydroxy functional groups, said method consisting essentially of immersing the developed photopolymer plate layer in a bath consisting essentially of boiling water for sufficient time to swell the layer and then scraping the swollen layer from the substrate.

2. The method of claim 1 in which said photopolymer is formed by polymerizing a mixture of water-soluble monofunctional and polyfunctional ethylenically unsaturated monomers.

3. The method of claim 1 in which said layer includes a partially saponified polyvinyl acetate.

4. The method of claim 1 in which said support substrate comprises a metallic plate.

5. The method of claim 4 in which said metallic plate is formed of a metal selected from the group consisting of aluminum, tin, iron and galvanized steel.

6. The method of claim 1 in which the duration of said immersion is at least about 5 minutes.

* * * * *